(12) United States Patent
Badami et al.

(10) Patent No.: US 6,181,420 B1
(45) Date of Patent: Jan. 30, 2001

(54) INTERFEROMETRY SYSTEM HAVING REDUCED CYCLIC ERRORS

(75) Inventors: Vivek G. Badami, Charlotte; Steven R. Patterson, Concord, both of NC (US); Carl A. Zanoni, Middlefield, CT (US)

(73) Assignees: Zygo Corporation, Middlefield, CT (US); University of North Carolina at Charlotte, Charlotte, NC (US)

( * ) Notice: Under 35 U.S.C. 154(b), the term of this patent shall be extended for 0 days.

(21) Appl. No.: 09/168,200

(22) Filed: Oct. 6, 1998

(51) Int. Cl.[7] .................................................... G01B 9/02
(52) U.S. Cl. ............................ 356/349; 356/351; 356/345
(58) Field of Search .................................. 356/349, 351, 356/345

(56) References Cited

U.S. PATENT DOCUMENTS 5,663,793 * 9/1997 De Groot ............................ 356/351
6,008,902   12/1999 Rinn .

* cited by examiner

*Primary Examiner*—Frank G. Font
*Assistant Examiner*—Andrew H. Lee

(74) *Attorney, Agent, or Firm*—Fish & Richardson P.C.

(57) ABSTRACT

The invention features a phase measurement system for minimizing cyclic errors in a relative phase between exit reference and measurement beams emerging from an interferometer. The phase measurement system includes: a first optical processing channel including a first polarizer and a first detector, wherein during operation a first portion of the exit reference and measurement beams pass through the first polarizer to produce a first mixed beam and wherein the first detector measures an intensity of the first mixed beam; a second optical processing channel including a quarter wave retarder, a second polarizer, and a second detector, wherein during operation a second portion of the exit reference and measurement beams passes through the retarder and then the second polarizer to produce a second mixed beam and wherein the second detector measures an intensity of the second mixed beam; and a signal processor which during operation receives signals from the first and second detectors indicative of the intensities of the first and second mixed beams and processes the signals to determine, and minimize cyclic errors in, the relative phase between the exit reference and measurement beams. The invention also features interferometry, lithography, and beam writing systems that include the phase measurement system to improve the accuracy of interferometric distance measurements.

32 Claims, 10 Drawing Sheets

INTERFEROMETRY SYSTEM HAVING REDUCED CYCLIC ERRORS

BACKGROUND OF THE INVENTION

This invention relates to interferometers, e.g., displacement measuring interferometers for measuring displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam, which subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2 vp/\lambda$, where $v$ is the relative velocity of the measurement and reference objects, $\lambda$ is the average wavelength of the measurement and reference beams, and $p$ is the number of passes to the reference and measurement objects. Changes in the relative position of the measurement object correspond to changes in the phase of the measured interference signal, with a $2\pi$ phase change substantially equal to a distance change L of $\lambda/(2 np)$, where n is the refractive index of the medium through which the light beams travel, e.g., air or vacuum, and where L is a one-way distance change, e.g., the change in position of a stage that includes the measurement object.

Unfortunately, this equality is not always exact. Many interferometers include what are known as "cyclic errors," which are contributions to the phase of the measured interference signal and have a sinusoidal dependence on the change in optical path length $2 pnL$. In particular, the first order cyclic error has a sinusoidal dependence on $(4 \pi pnL)/\lambda$ and the second order cyclic error has a sinusoidal dependence on $2(4 \pi pnL)/\lambda$. Higher order cyclic errors can also be present.

Cyclic errors can be produced by "beam mixing," in which a portion of an input beam that nominally forms the reference beam propagates along the measurement path and/or a portion of an input beam that nominally forms the measurement beam propagates along the reference path. Such beam mixing can be caused by ellipticity in the polarizations of the input beams and imperfections in the interferometer components, e.g., imperfections in a polarizing beam splitter used to direct orthogonally polarized input beams along respective reference and measurement paths. Because of beam mixing and the resulting cyclic errors, there is not a strictly linear relation between changes in the phase of the measured interference signal and the relative optical path length $2 pnL$ between the reference and measurement paths. If not compensated, cyclic errors caused by beam mixing can limit the accuracy of distance changes measured by an interferometer.

SUMMARY OF THE INVENTION

The invention features an interferometry system that minimizes cyclic errors. A phase measurement portion of the system forms two output beams from exit reference and measurement beams of an interferometer, passes one output beam through a first polarizer to form a first mixed beam, passes the other output beam through a quarter wave plate followed by a second polarizer to form a second mixed beam, and measures the phases of the first and second mixed beams. Proper alignment of the two polarizers minimizes the first order cyclic error and proper alignment of the quarter wave minimizes the second order cyclic error by averaging the measured phases of the two mixed beams.

In general, in one aspect, the invention features a phase measurement system for minimizing cyclic errors in a relative phase between exit reference and measurement beams emerging from an interferometer. The phase measurement system includes a first optical processing channel, a second optical processing channel, and a signal processor. The first optical processing channel includes a first polarizer and a first detector. During operation, a first portion of the exit reference and measurement beams pass through the first polarizer to produce a first mixed beam and wherein the first detector measures an intensity of the first mixed beam. The second optical processing channel includes a quarter wave retarder, a second polarizer, and a second detector. During operation, a second portion of the exit reference and measurement beams passes through the retarder and then the second polarizer to produce a second mixed beam and the second detector measures an intensity of the second mixed beam. The signal processor receives signals from the first and second detectors indicative of the intensities of the first and second mixed beams and processes the signals to determine, and minimize cyclic errors in, the relative phase between the exit reference and measurement beams.

Embodiments of the phase measurement system can include any of the following features.

The signal processor can include first and second phase interpolators, which during operation receive the first and second signals, respectively, and determine phases of the first and second signals, respectively. The exit reference and measurement beams can have different frequencies that define a heterodyne signal in each of the first and second signals and the phases determined by the phase interpolators can correspond to the heterodyne signals. The signal processor can further include an operational circuit connected to the first and second phase interpolators, wherein during operation the operational circuit processes the phases determined by the phase interpolators to determine the relative phase between the exit reference and measurement beams.

For example, the operational circuit can average the phases determined by the phase interpolators to determine the relative phase between the exit reference and measurement beams.

Alternatively, the signal processor can include a phase-shifter that phase shifts one of the signals relative to the other signal and an operational circuit that processes the phase-shifted signal and the other signal to produce a processed signal indicative of an average intensity. For example, the processed signal can be indicative of a weighted arithmetic average of the intensities of the mixed beams. The signal processor can further include a phase interpolator connected to the operational circuit, which, during operation, determines a phase of the processed signal to give relative phase between the exit reference and measurement beams.

The exit reference and measurement beams can have substantially orthogonal linear polarizations. The fast axis of the quarter wave retarder can be oriented substantially parallel to one of the substantially orthogonal linear polarizations. The phase measurement system can further include a non-polarizing beam splitter for separating the exit reference and measurement beams into the first and second portions. The exit reference and measurement beams can include different frequencies, and the signals generated by the detectors can each include a heterodyne signal defined by the different frequencies.

In general, in another aspect, the invention features a phase measurement system for minimizing cyclic errors in an interferometer. The interferometer directs a reference beam along a reference path and a measurement beam along a measurement path and combines the reference and measurement beams to produce overlapping exit reference and measurement beams. The overlapping exit reference and measurement beams include substantially orthogonal linear polarizations and different frequencies. Changes in a relative phase between the overlapping exit reference and measurement beams are indicative of changes in a relative optical path length between the reference and measurement paths. The phase measurement system includes a non-polarizing beam splitter, a first optical processing channel, a second optical processing channel, and a signal processor.

During operation, the non-polarizing beam splitter splits the overlapping exit reference and measurement beams into first and second output beams. The first optical processing channel includes a first polarizer and a first detector. During operation, the first polarizer receives the first output beam and mixes polarizations of the first output beam to form a first mixed beam. The detector measures an intensity of the first mixed beam. The second optical processing channel includes a quarter wave retarder, a polarizer, and a detector. During operation, the quarter wave retarder receives the second output beam and produces a retarded beam. The second polarizer receives the retarded beam and mixes polarizations of the retarded beam to produce a second mixed beam. The second detector measures an intensity of the second mixed beam. The signal processor receives signals from the first and second detectors indicative of the intensities of the first and second mixed beams and processes the signals to determine, and minimize cyclic errors in, the relative phase between the exit reference and measurement beams.

In another aspect, the invention features an interferometry system that includes an interferometer and any of the phase measurement systems described above.

In another aspect, the invention features a lithography system for use in fabricating integrated circuits on a wafer. The system includes: a stage for supporting the wafer; an illumination system for imaging spatially patterned radiation onto the wafer; a positioning system for adjusting the position of the stage relative to the imaged radiation; and an interferometry system having any of the phase measurement systems described above for measuring the position of the wafer relative to the imaged radiation.

In another aspect, the invention features a lithography system for use in fabricating integrated circuits on a wafer. The system includes: a stage for supporting the wafer; and an illumination system including a radiation source, a mask, a positioning system, a lens assembly, and an interferometry system having any of the phase measurement system described above. During operation, the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

In another aspect, the invention features a lithography system for fabricating integrated circuits including first and second components, and an interferometry system having any of the phase measurement systems described above. The first and second components are movable relative to each other and the interferometry system monitors the position of the first component relative to the second component.

In another aspect, the invention features a beam writing system for use in fabricating a lithography mask. The system includes: a source providing a write beam to pattern a substrate; a stage supporting the substrate; a beam directing assembly for delivering the write beam to the substrate; a positioning system for positioning the stage and beam directing assembly relative one another; and an interferometry system having any of the phase measurement systems described above for measuring the position of the stage relative to the beam directing assembly.

In general, in another aspect, the invention features an interferometry method for reducing cyclic errors. The method includes: mixing polarizations of a first portion of exit reference and measurement beams from an interferometer to produce a first mixed beam; introducing a quarter wave phase shift between polarizations of a second portion of the exit reference and measurement beams to produce a retarded beam; mixing polarizations of the retarded beam to produce a second mixed beam; measuring intensities of the first and second mixed beams; and processing the measured intensities to reduce cyclic errors.

Embodiments of the interferometry method can include any of the following features.

The processing step can include determining a phase for each of the intensities of the first and second mixed beams. The exit reference and measurement beam can have different frequencies that define a heterodyne signal in each of the intensities and the determined phases can correspond to the heterodyne signals. The processing step can further include averaging the phases of the intensities of the first and second mixed beams to define an average phase with reduced cyclic error.

Alternatively, the exit reference and measurement beam can have different frequencies that define a heterodyne signal in each of the intensities and the processing step can include determining the heterodyne signal in each of the intensities. The processing step can further include phase shifting one of the heterodyne signals relative to the other and averaging the phase-shifted heterodyne signal and the other heterodyne signal to give an average heterodyne signal. The processing step can further include determining a phase of the average heterodyne signal.

In another aspect, the invention features a lithography method for use in fabricating integrated circuits. The method includes: imaging spatially patterned radiation onto a wafer; positioning the wafer relative to the imaged radiation; and measuring the position of the wafer relative to the imaged radiation using any of the interferometry methods described above. One of a stage supporting the wafer and an illumination system producing the radiation includes the measurement object.

In another aspect, the invention features a lithography method for use in the fabrication of integrated circuits. The method includes: directing input radiation through a mask to produce spatially patterned radiation; positioning the mask relative to the input radiation; measuring the position of the mask relative to the input radiation using any of the interferometry methods described above; and imaging the spatially patterned radiation onto a wafer. One of a stage supporting the mask and a illumination system providing the input radiation includes the measurement object.

In another aspect, the invention features a lithography method that includes: positioning a first component of a lithography system relative to a second component of a lithography system to expose a wafer to spatially patterned radiation; and measuring the position of the first component relative to the second component using any of the interferometry methods described above. The first component includes the measurement object.

In another aspect, the invention features a beam writing method for use in fabricating a lithography mask. The method includes: directing a write beam to a substrate to pattern the substrate; positioning the substrate relative to the write beam; and measuring the position of the substrate relative to the write beam using any of the interferometry methods described above.

Embodiments of the invention minimize cyclic error contributions to optical path length changes measured by an interferometer. As a result the invention increases the accuracy of the interferometer, and any system employing one or more of the interferometers, such as a lithography scanner or stepper system.

Other features, aspects, and advantages will be clear from the following detailed description and from the claims.

BRIEF DESCRIPTION OF THE DRAWINGS

In FIG. 3 there is no cyclic order compensation. In FIG. 4 the first order cyclic error is minimized and in FIG. 5 the first and second cyclic errors are minimized.

FIG. 7a is a schematic drawing of a lithography exposure system employing an interferometry system having the phase measurement portion of FIG. 1. FIGS. 7b and 7c are flow charts describing steps in manufacturing integrated circuits.

DETAILED DESCRIPTION

Figure 1:
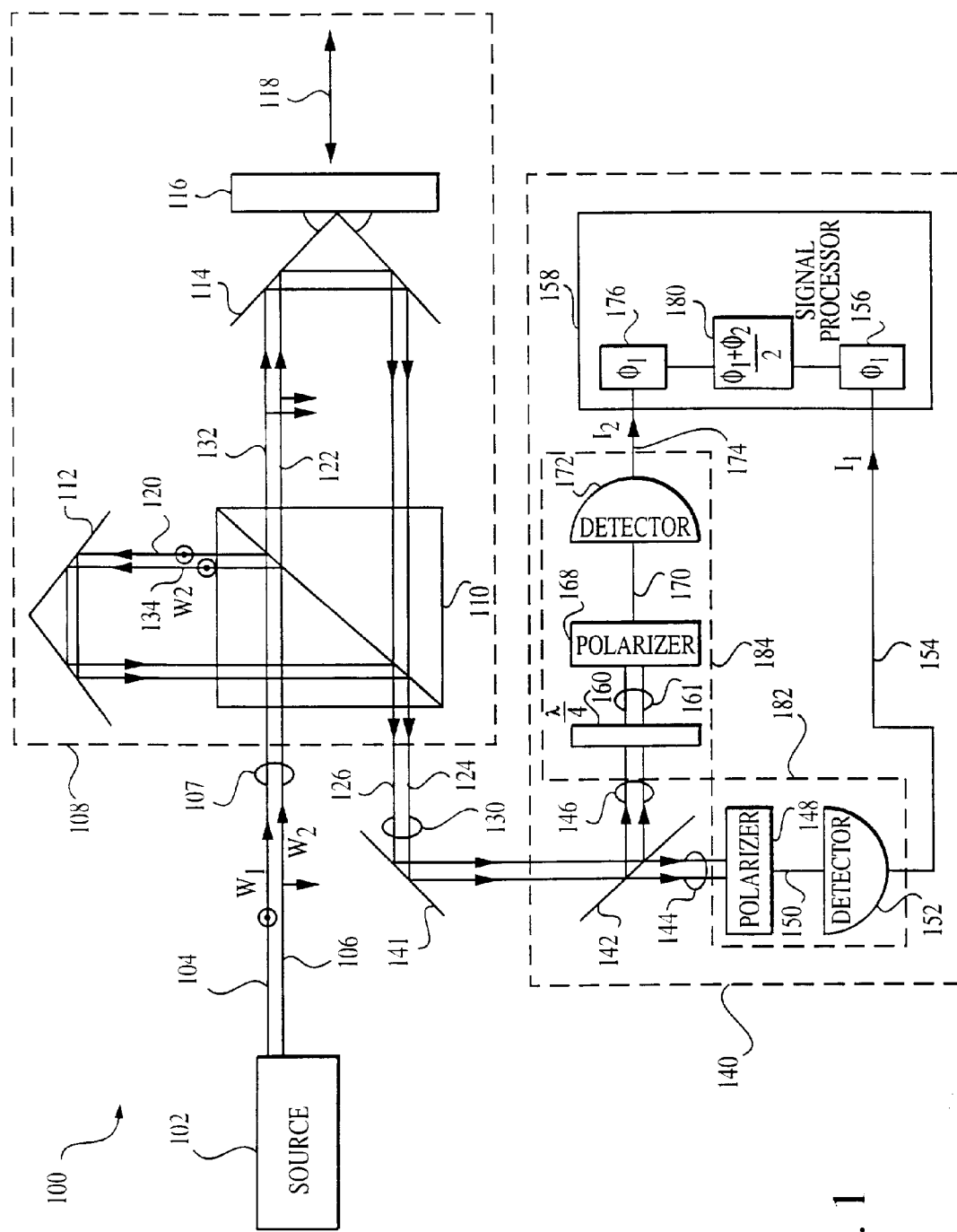
FIG. 1 is a schematic diagram of an interferometry system including a phase measurement portion that reduces cyclic errors.

A schematic of an interferometry system 100 is shown in FIG. 1. A laser source 102 produces a pair of input beams 104 and 106 and directs the beams towards an interferometer 108. Input beams 104 and 106 are polarized orthogonal to one another and have different frequencies, beam 104 being substantially linearly polarized orthogonal to the plane of FIG. 1 and having a frequency $\omega_1/2\pi$ and beam 106 being substantially linearly polarized in the plane of FIG. 1 and having a frequency $\omega_2/2\pi$. Source 102 can produce the orthogonally polarized and frequency-shifted input beams using any of a number of techniques known in the art, including, e.g., acousto-optical modulation, Zeeman-splitting, or the use of birefringent elements internal to a laser. In the presently described embodiment input beams 104 and 106 are collinear, i.e., parallel and coextensive and enter interferometer 108 as a single beam 107, however for purposes of illustration the input beams are shown separately in FIG. 1. In other embodiments, input beams 104 and 106 can be spatially separated upon entering the interferometer. In such cases, a portion of each of the spatially separated input beams is sent to a reference phase detector, which mixes the portions to determines the relative phase between the input beams prior to the interferometer.

Interferometer 108 directs one of the input beams along a reference path to define a reference beam and the other of the input beams along a measurement path to define a measurement beam. The interferometer then combines the reference and measurement beams to form overlapping exit reference and measurement beams indicative of the relative optical path length between the reference and measurement arms. The interferometer can be any of a number interferometers known in the art including, e.g., multipass interferometers, high-stability plane mirror interferometers, differential plane mirror interferometers, multi-axis interferometers, and interferometers using one or more retro-reflectors. See, e.g., N. Bobroff, *Measurement Science and Technology*, 4:907, 1993 and C. Zanoni, *VDI Berichte Nr.*, 749:93, 1989, the contents of which are incorporated herein by reference.

In the presently described embodiment, interferometer 108 includes a polarizing beam splitter 110, a reference retroreflector 112, and a measurement retroreflector 114 attached to a measurement object 116 that translates along the direction of arrow 118. The polarizing beam splitter directs a substantial portion of input beam 104 towards reference retroreflector 112 to form a reference beam 120 and define a reference path. Similarly, the polarizing beam splitter directs a substantial portion of input beam 106 towards measurement retroreflector 114 to form a measurement beam 122 and define a measurement path. Retroreflectors 112 and 114 then reflect reference and measurement beams 120 and 122 back to polarizing beam splitter 110, which combines the beams to define exit reference and measurement beams 124 and 126. In the presently described embodiment, the exit reference and measurement beams are collinear and form a single beam 130, however for purposes of illustration the reference and measurement beams are shown separately in FIG. 1. In other embodiments, the exit reference and measurement beams can exit the interferometer as spatially separated beams, at least portions of which are subsequently recombined to form one or more output beams.

Because of imperfections in the source 102 or imperfections in optics directing input beams 104 and 106 to the interferometer, the input beams are typically not exactly linearly polarized upon entering interferometer 108. In addition, there can be imperfections in the structure and alignment of polarizing beam splitter 110. As a result, there is beam mixing in interferometer 108. In particular, a small portion 132 of input beam 104 (having frequency $\omega_1/2\pi$ propagates along the measurement path and combines with measurement beam 122 (having frequency $\omega_2/2\pi$) to form exit measurement beam 126. Similarly, a small portion 134 of input beam 106 (having frequency $\omega_2/2\pi$) is directed along the reference path and combines with reference beam 120 (having frequency $\omega_1/2\pi$) to form exit reference beam 124.

Interferometry system 100 includes a phase measurement portion 140 and mirror 141 directs the collinear exit reference and measurement beams 124 and 126 from interferometer 108 to the phase measurement portion. Phase measurement portion 140 includes a non-polarizing beam splitter 142 that splits the collinear exit beams into a first output beam 144 and a second output beam 146.

Output beam 144 passes through a first polarizer 148 which mixes the polarizations of the portions of the exit reference and measurements beams contained in beam 144 to form a first mixed beam 150. Polarizer 148 is nominally oriented along an axis that forms a 45° angle with the plane of FIG. 1 and is also referred to as the first analyzer. A first detector 152, e.g., a photodiode, measures the intensity $I_1$ of the first mixed beam 150. Polarizer 148 and detector 152 define a first optical channel 182 for phase measurement portion 140. After measuring the intensity of mixed beam 150, detector 152 sends a signal 154 indicative of intensity $I_1$ to a signal processor 158. Controller 158 includes a first phase interpolator 156 that determines the phase $\phi_1$ of mixed beam 150 corresponding to the heterodyne frequency $\Delta\omega/2\pi=(\omega_1-\omega_2)/2\pi$.

Unlike output beam 144, output beam 146 passes through a quarter wave plate 160 before passing through a second polarizer 168. Quarter wave plate 160 is nominally oriented with its fast axis in the plane of FIG. 1 to introduce a $\pi/2$ phase shift between the portions of the exit reference and measurements beams contained in output beam 146 to produce retarded beam 161. Alternatively, the $\pi/2$ phase shift can be introduced by orienting the fast axis perpendicular to the plane of FIG. 1. Following the quarter wave plate, the second polarizer mixes the polarizations of the portions of the exit reference and measurements beams to form a second mixed beam 170. Polarizer 168 is nominally oriented along an axis that forms a 45° angle with the plane of FIG. 1 and is also referred to as the second analyzer. A second detector 172, e.g., a photodiode, measures the intensity $I_2$ of second mixed beam 170. Quarter wave plate 160, polarizer 168, and detector 172 define a second optical channel 184 for phase measurement portion 140. After measuring the intensity of mixed beam 170, detector 172 sends a signal 174 indicative of intensity $I_2$ to signal processor 158, which also includes a second phase interpolator 176. Phase interpolator 176 determines the phase $\phi_2$ of mixed beam 170 corresponding to the heterodyne frequency $\Delta\omega/2\pi$.

To compensate the phases measured by phase interpolators 156 and 176 for second order cyclic error contributions, a summing circuit 180 in signal processor 158 averages the phases $\phi_1$ and $\phi_2$ to give an average phase $\phi_A$. As described in greater detail below, the first order cyclic error contributions to phases $\phi_1$ and $\phi_2$ are minimized by adjusting the orientations of polarizers 148 and 168 by a small amount from the nominal 45° orientations. As a result, changes in the average phase $\phi_A$ can be more accurately equated to $(4\pi pnL)/\lambda$ to determine changes in the optical path length difference 2 pnL between the reference and measurement paths.

The interferometry system shown in FIG. 1 can be modeled using the Jones calculus, which is well known in the art, see, e.g., J. M. De Freitas and M. A. Player, *J. Mod. Opt.*, 42:1875, 1995. Using such a formalism, the heterodyne signal portion $I_{1h}$ of intensity $I_1$ measured by detector 152 is proportional to:

$$I_{1h} \propto 2\Re\{(\Gamma_0 e^{i\Delta\phi} + \Gamma_1 + \Gamma_2 e^{-i\Delta\phi})E_1\overline{E_2}e^{i\Delta\omega t}\} \quad (1)$$

where $\Delta\phi$ equals $(4\pi pnL)/\lambda$, $E_1$ and $E_2$ are the amplitudes of the input beams 104 and 106, and $\Delta\omega$ is the heterodyne frequency difference. The script R denotes taking the real part of the expression in parenthesis and the upper bar denotes taking a complex conjugate of the term beneath it. Each of the terms in Equation (1) may be further expanded as follows:

$$\Gamma_0 = 1 - \frac{z}{\sin 2\theta}[(\alpha_{21} - \overline{\alpha}_{12}) - \cos 2\theta(\alpha_{21} + \overline{\alpha}_{12})] - z^2(\overline{\alpha}_{12}\alpha_{21}) \quad (2)$$

$$\Gamma_1 = (\alpha_{12} + \overline{\alpha}_{21}) - \frac{z}{\sin 2\theta}[(|\alpha_{21}|^2 - |\alpha_{12}|^2) - \cos 2\theta(|\alpha_{12}|^2 + |\alpha_{21}|^2 + 2)] - z^2(\overline{\alpha}_{12} + \alpha_{21}) \quad (3)$$

$$\Gamma_2 = (\overline{\alpha}_{21}\alpha_{12}) + \frac{z}{\sin 2\theta}[(\alpha_{12} - \overline{\alpha}_{21}) + \cos 2\theta(\alpha_{12} + \overline{\alpha}_{21})] - z^2 \quad (4)$$

The term 'z' in Equations (2)–(4) is proportional to the degree of ellipticity in input beams 104 and 106. Ellipticity in the polarizations of the input beams 104 is modeled by assuming that exactly linearly polarized input beams pass through an entrance retarder, such as a quarter wave plate, prior to entering interferometer 108 as input beams 104 and 106. The Jones matrix for the entrance retarder is given by:

$$J_{retarder} = \begin{pmatrix} p & q \\ -\overline{q} & \overline{p} \end{pmatrix} \quad (4)$$

so that the degree of ellipticity 'z' is given by:

$$z = \frac{\overline{q}}{p} \quad (5)$$

The terms $\alpha_{12}$ and $\alpha_{21}$ correspond to leakage terms resulting from imperfections in polarizing beam splitter 110. The term $\alpha_{12}$ is a coefficient for the leakage of input beam 104 into the measurement path and the term $\alpha_{21}$ is a coefficient for the leakage of input beam 106 into the reference path, when both of the input beams are exactly linearly polarized parallel and perpendicular to the plane of FIG. 1, respectively. The angle $\theta$ is the angle of orientation of polarizer 148 with respect to the plane of FIG. 1.

The $\Gamma_0$ term corresponds to the basic heterodyne signal, while the terms $\Gamma_1$ and $\Gamma_2$ form the basis of the first and second order cyclic errors, respectively. Examination of Equation (3) shows that $\Gamma_1$ can be minimized by careful alignment of polarizer 148 about a nominal 45°. In particular, in cases in which polarizing beam splitter 110 is of reasonable quality, the leakage terms in $\Gamma_1$ are small and the dominant term is the middle term that is first order in "z." This middle term can be made identically zero by adjusting the value of the cos $2\theta$ term from zero (an identical 45° orientation) to a small but non-zero value (a nominal 45° orientation). In addition, examination of Equations (2) and (4) indicate that adjusting the value of the cos 2θ term in this way does not substantially change the values of $\Gamma_0$ and $\Gamma_2$. The resulting signal is then substantially free of the first-order cyclic error and is dominated by the second-order cyclic error.

By passing output beam 146 through quarter wave plate 160 and orienting polarizer 168 similarly to polarizer 148, signal 174 is in phase quadrature with signal 154. In particular, the heterodyne signal portion $I_{2h}$ of intensity $I_2$ measured by detector 172 is identical to that given for $I_{1h}$ in Equation (1) except that the signal is phase shifted by π/2, i.e., the exp(iΔωt) term is replaced with an exp(iΔωt+iπ/2) term, and the expressions for $\Gamma_0$, $\Gamma_1$, and $\Gamma_2$ are given by Equations (7)–(9) below:

$$\Gamma_0 = 1 + \frac{iz}{\sin 2\theta}[(\alpha_{21} - \overline{\alpha}_{12}) - \cos 2\theta(\alpha_{21} + \overline{\alpha}_{12})] - z^2(\overline{\alpha}_{12}\alpha_{21}) \quad (7)$$

$$\Gamma_1 = (\alpha_{12} + \overline{\alpha}_{21}) + \frac{iz}{\sin 2\theta}[(|\alpha_{21}|^2 - |\alpha_{12}|^2) - \cos 2\theta(|\alpha_{12}|^2 + |\alpha_{21}|^2 + 2)] + z^2(\overline{\alpha}_{12} + \alpha_{21}) \quad (8)$$

$$\Gamma_2 = (\overline{\alpha}_{21}\alpha_{12}) - \frac{iz}{\sin 2\theta}[(\alpha_{12} - \overline{\alpha}_{21}) + \cos 2\theta(\alpha_{12} + \overline{\alpha}_{21})] + z^2 \quad (9)$$

Note that neglecting a constant factor of "−i," the coefficient of the first order "z" term in $\Gamma_1$ is identical in both Equations (3) and (8). Since the "z" term in $\Gamma_1$ is typically the dominant term, similar orientations of polarizers 148 and 168 about nominal 45° orientations minimize the first-order cyclic error in both $I_{1h}$ and $I_{2h}$ by making the coefficient of the first order "z" term in corresponding $\Gamma_1$'s equal to zero.

Furthermore, since the leakage terms are typically small and the value of cos 2θ is small, the dominant term for respective $\Gamma_2$'s in Equations (4) and (9) is the $z^2$ term relating to input beam ellipticity. Because the second output beam passes through the quarter wave plate, the $z^2$ terms in Equations (4) and (9) have opposite signs. As a result, the averaging of the phases $\phi_1$ and $\phi_2$ by signal processor 158 produces an average phase $\phi_A$ that is relatively free of second order cyclic error. Using the average phase $\phi_A$, signal processor 158 determines optical path length changes 2 npL between the reference and measurement paths according to $\phi_A = (4 \pi pnL)\lambda$.

The following experiment demonstrates the effectiveness of the phase measurement portion 140 in the interferometry system described above. In the experiment, an interferometer similar to that in FIG. 1 was used except that there was no measurement object and the measurement retroreflector was stationary so that the actual path length between the reference and measurement paths was fixed. In addition, the interferometer in the experiment was placed in a vacuum chamber, which included a window through which the input and exit beams passed. By precisely controlling the air pressure in the vacuum chamber the relative optical path 2 npL between the reference and measurement path was precisely varied through the pressure dependence of the refractive index n.

The path length difference L was equal to 7.9 mm and the pressure was varied under computer control over a range of 90 kPa resulting in an optical path length variation of approximately 5λ (3000 nm approx.). The pressure could be varied in increments corresponding to an optical path change of approximately λ/16 and was monitored using a pressure transducer. The temperature of the air inside the chamber is monitored using a thermistor.

A two frequency Helium Neon (HeNe) laser was used as the laser source and a quarter wave plate (the entrance retarder) was placed between the HeNe laser and the interferometer to introduce an elliptical component to the polarizations of the input beams. The fast axis of the entrance retarder was oriented at a fixed azimuthal angle of 10° relative to the linear polarization of one of the input beams. This produced in ellipticy in the input beam corresponding to about z=0.2. The phase measurement portion of the interferometry system in the experiment was identical to that of FIG. 1.

A typical data run consisted of two scans, a forward scan with increasing pressure and a reverse scan with decreasing pressure. At each point in the scan, the phase, pressure and temperature of the air and interferometer body were recorded under computer control. The acquired data for $\phi_1$ was subjected to a multi-variant regression with pressure P and temperature T being the independent variables, i.e., $\phi_1 = [4 \pi pn(P,T)L]/\lambda$. The deviation of the raw data from the best fit to these variables was then displayed as a nonlinearity corresponding to first and second order cyclic errors. Similar analyses were performed on $\phi_2$ and $\phi_A$. Fourier analysis of each measured deviation provided values for the coefficients of the first and second order cyclic errors. Values of these coefficients were measured over a 10° range of orientation angles for the analyzers 148 and 168 about a nominal 45° orientation.

Figure 2:
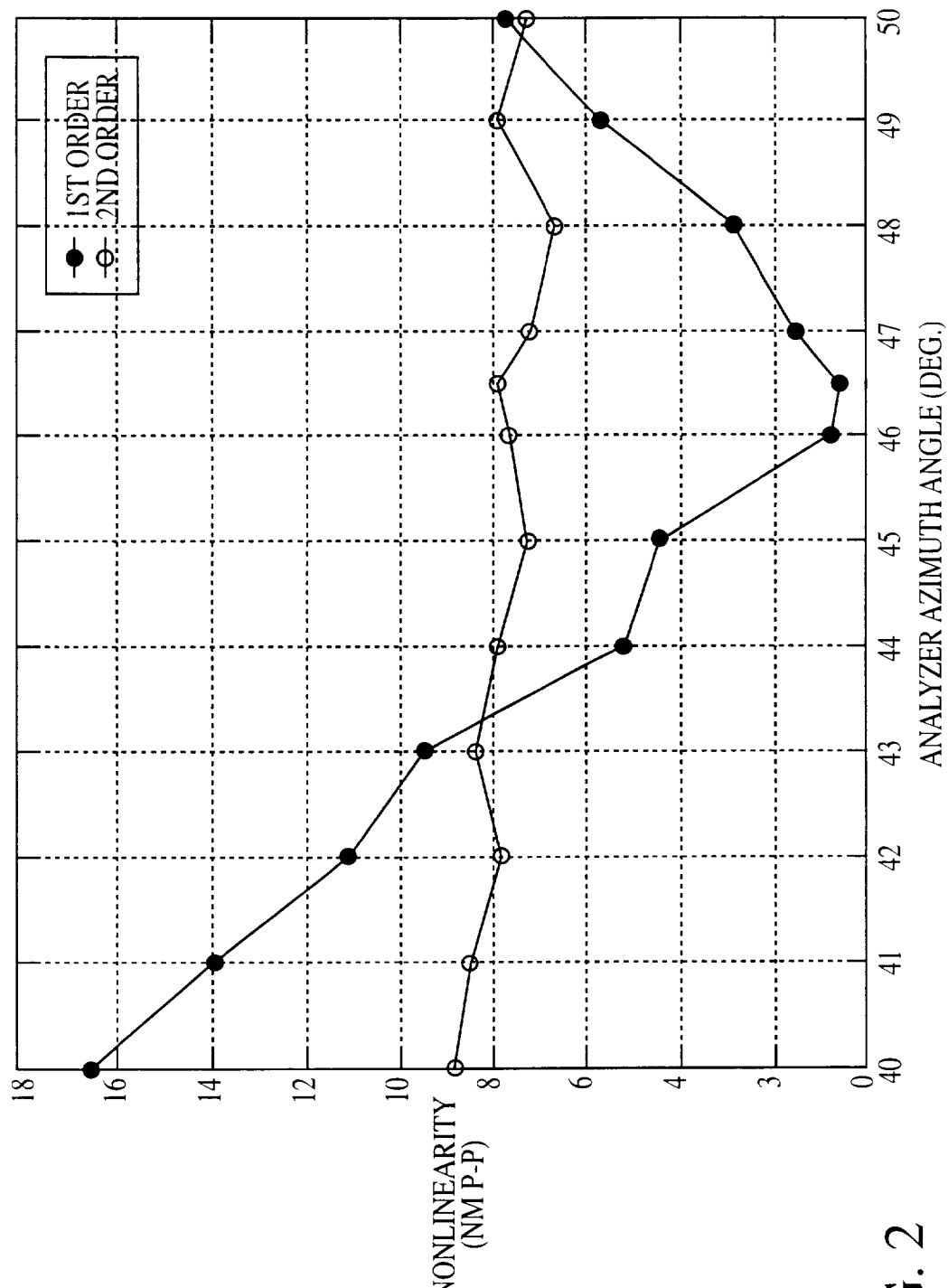
FIG. 2 is a graph of coefficients of first and second order cyclic errors for an experimental interferometer and different arrangements of the phase measurement portion of FIG. 1.

As an example, the cyclic error coefficients for $\phi_1$ are shown in FIG. 2. As predicted by Equation (3) and shown in FIG. 2, the first order cyclic error coefficient (filled circles) was minimized when analyzer 148 was oriented at a small deviation, e.g., less than about 2°, from the nominal 45° orientation. Also, as predicted by Equation (4) the second order cyclic error coefficient (empty circles) was substantially unaffected by the changes of the analyzer over the range of orientations.

Figure 3:
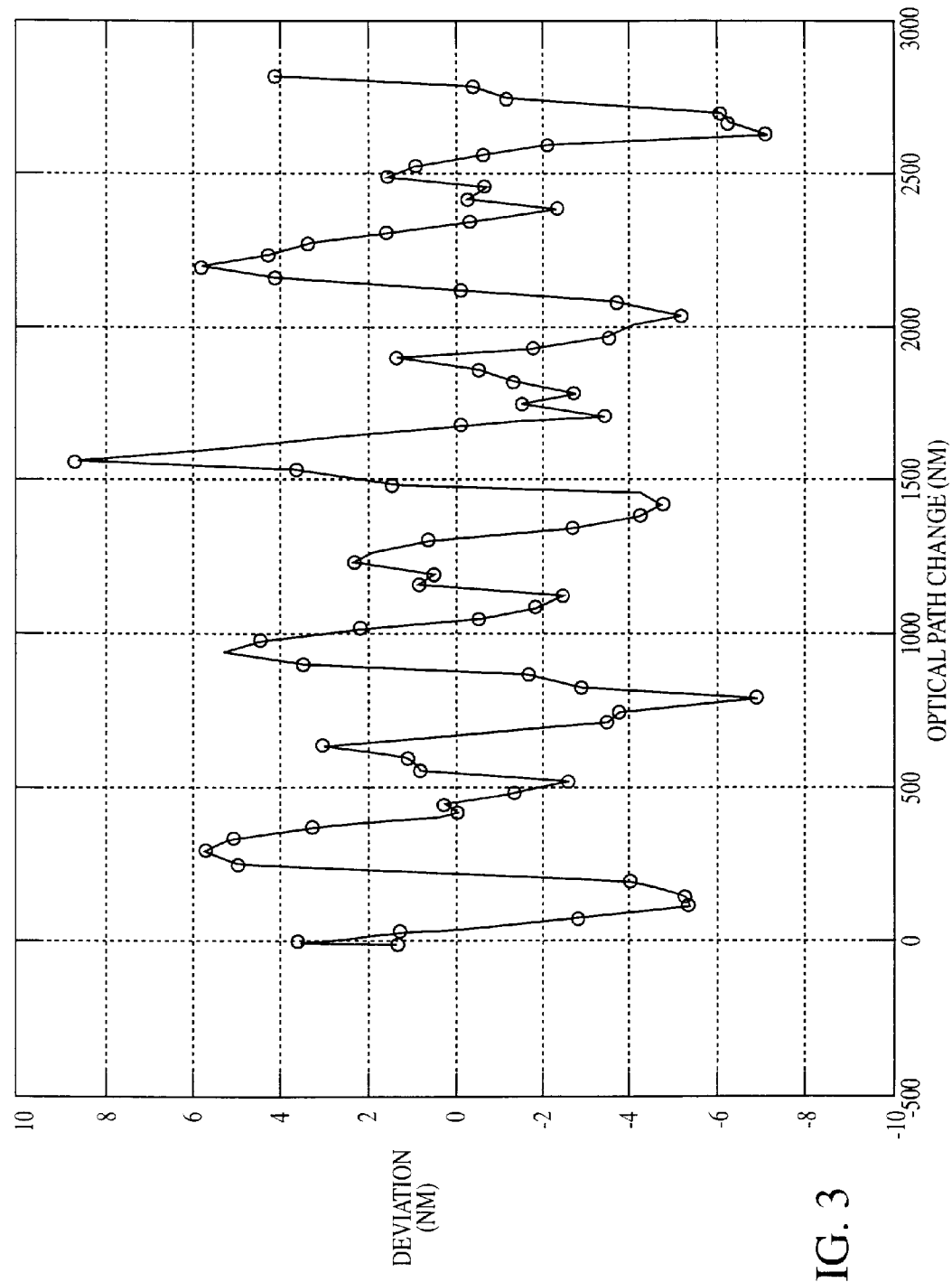
FIGS. 3–5 are graphs of non-linear deviations of the experimental interferometer of FIG. 1 as a function of optical path length.
Figure 4:
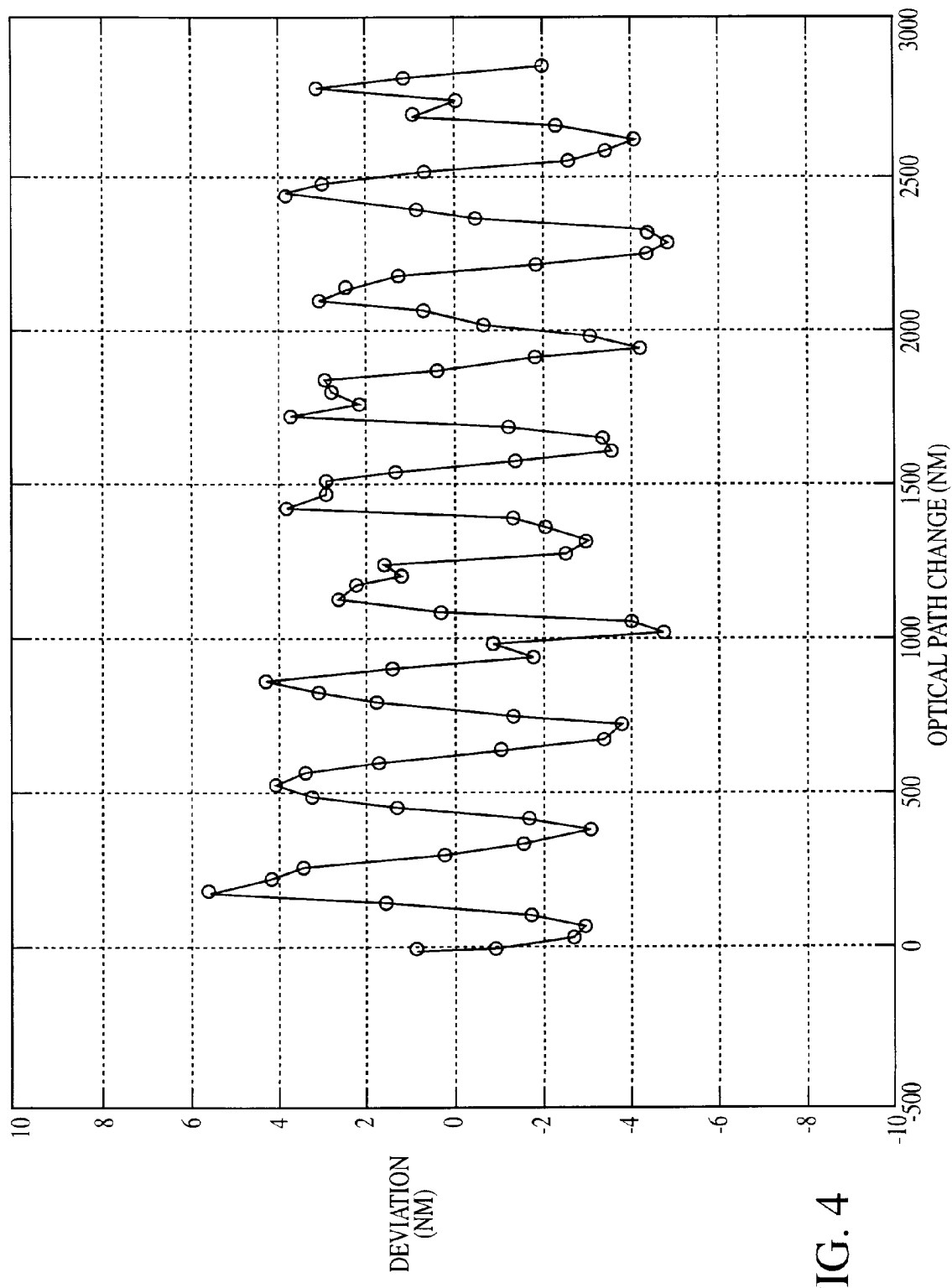

FIGS. 3 and 4 show scans of the deviations for analyzer 148 orientated at angles differing by 1.5°. The scan in FIG. 3 shows deviations corresponding to both first and second order cyclic errors, whereas the scan in FIG. 4 shows deviations corresponding only to a second order cyclic error, the first order cyclic error being minimized. The values of the coefficients in for the first and second order cyclic errors were 4.3 nm and 6.9 nm, respectively, for FIG. 3, and 0.39 nm and 7.4 nm, respectively, for FIG. 4.

Figure 5:
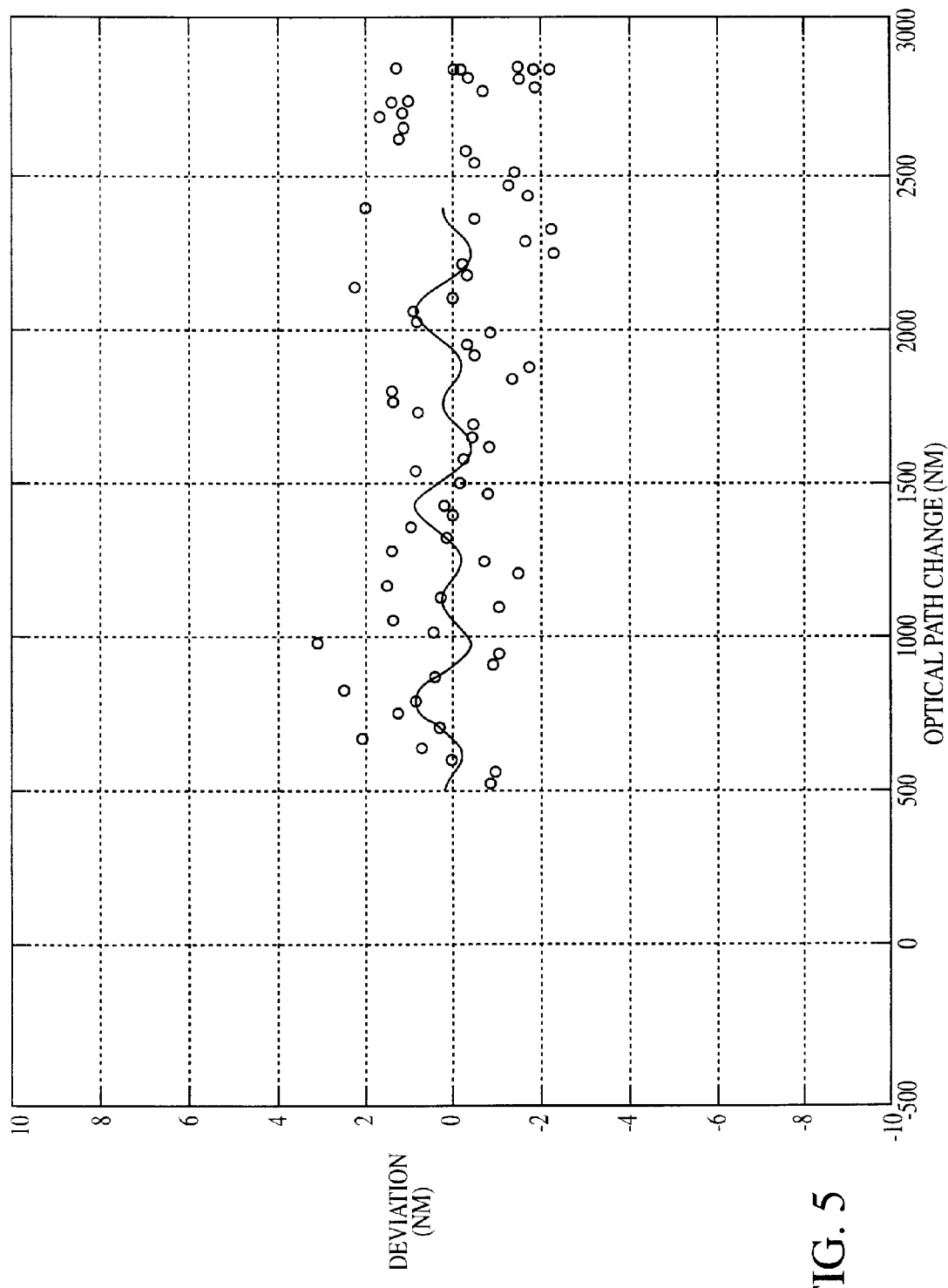

With quarter wave plate 160 not yet introduced into the path of beam 146, analyzer 168 was oriented in a manner similar to that of analyzer 148 to minimize first order cyclic error in $\phi_2$. Thereafter, quarter wave plate 160 was introduced into the path of 146 with its fast axis nominally oriented in the plane of FIG. 1 and signal processor 158 averaged the phases $\phi_1$ and $\phi_2$ to produce $\phi_A$. The orientation of quarter wave plate 160 was then modified slightly (e.g., less than about 2°) to minimize the second order cyclic error in $\phi_A$. As a result, the nonlinear deviation for $\phi_A$ (shown in FIG. 5) corresponds to first and second order cyclic error coefficients of 0.7 nm and 0.8 nm, respectively. Thus, averaging the phases from the two channels decreases the magnitude of the second harmonic by almost an order of magnitude. The residual errors were consistent with errors observed when the interferometer was operated without inducing mixing by the entrance retarder and was dominated by interpolator noise.

Figure 6:
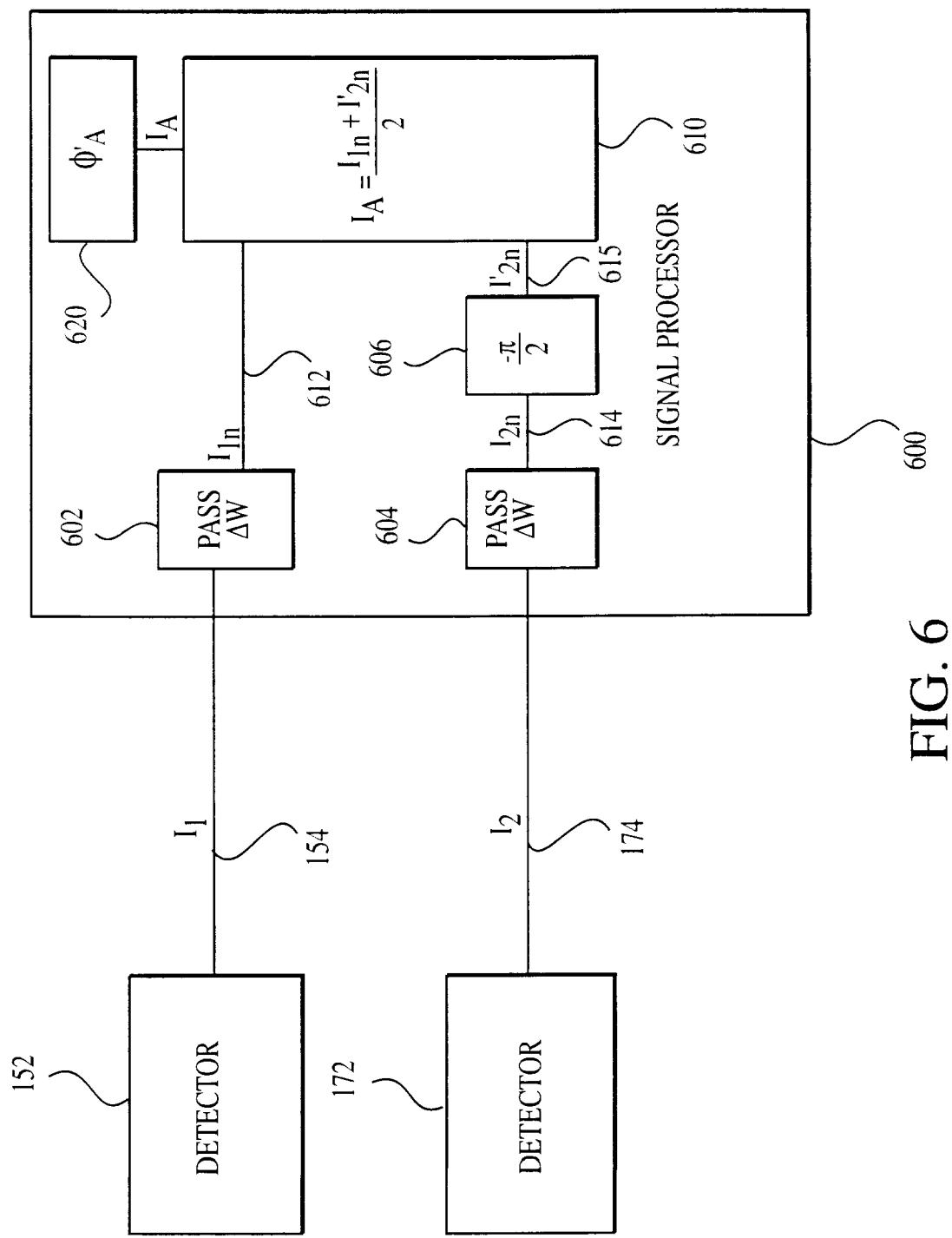
FIG. 6 is a schematic diagram of an alternative embodiment of the signal processor of FIG. 1.

In another embodiment of the phase measurement portion 140, a signal processor 600 includes frequency filters 602 and 604, a phase shifter 606, and a summing circuit 610, as shown in FIG. 6. Signals 154 and 174 from detectors 152 and 172, respectively, enter the signal processor as in FIG. 1. Within signal processor 600, signals 152 and 172 enter frequency filters 602 and 604, respectively. The frequency filters remove the quasi-DC components of intensities $I_1$ and $I_2$ to produce signals 612 and 614 indicative of heterodyne signal intensities $I_{1h}$ and $I_{2h}$, respectively. Phase shifter 606 receives signal 614 and phase shifts the signal by $-\pi/2$ to compensate for the effect of quarter wave plate 160 on the overall phase $I_{2h}$ and produce signal 615 indicative of a phase-shifted heterodyne signal intensity $I_{2h}'$ that is in-phase with $I_{1h}$. In particular, an expression for $I_{2h}'$ is identical to that given for $I_{1h}$ in Equation (1) except that the expressions for $\Gamma_0$, $\Gamma_1$, and $\Gamma_2$ are given by Equations (7)–(9).

Signals 612 and 615 enter summing circuit 610, which averages intensities $I_{1h}$ and $I_{2h}'$ to give $I_A$ and sends $I_A$ to a phase interpolator 620. Phase interpolator 620 determines the phase $\phi_A'$ of $I_A$ and signal processor 600 equates changes the phase $\phi_A'$ with optical path length changes $2$ pnL according to $\phi_A' = (4\pi pnL)/\lambda$. Equations (4) and (9) indicate that averaging the intensities $I_{1h}$ and $I_{2h}'$ cancels out the $z^2$ term, which can be the dominant term in the second order cyclic error. Thus, the signal processor 600 minimizes second order cyclic error contributions to the measured changes in optical path length $2$ pnL. Also, in some of these embodiments summing circuit 610 can weight signals 154 and 174 differently when determining $I_A$. Weighted averaging may be useful when the absolute values of signals 154 and 174 differ because, e.g., of imperfections in beam splitter 142 or differences in the responsiveness of detectors 152 and 172. In such cases, signal processor 600 can be calibrated to optimize the weighting in summing circuit 610 such that the cyclic errors are minimized.

In the embodiments of FIGS. 1 and 6, and any related embodiments, the signal processor can process signals 154 and 174 from the detectors 152 and 172 using any combination of analog and/or digital processing known in the art. For example, in the embodiment of FIG. 6 the frequency filters can include A-to-D converters, which convert analog signals from the detectors into digital signals processed by the phase shifter and summing circuit.

Any interferometry system including the phase measurement portion described above can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997). Overlay depends directly on the performance, i.e. accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the phase measurement portion described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems including the phase measurement portion described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

An example of a lithography scanner 700 using an interferometry system 726 is shown in FIG. 14a. The interferometry system is used to precisely measure the position of a wafer within an exposure system. Here, stage 722 is used to position the wafer relative to an exposure station. Scanner 700 comprises a frame 702, which carries other support structures and various components carried on those structures. An exposure base 704 has mounted on top of it a lens housing 706 atop of which is mounted a reticle or mask stage 716, which is used to support a reticle or mask. A positioning system for positioning the mask relative to the exposure station is indicated schematically by element 717. Positioning system 717 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 704 is a support base 713 that carries wafer stage 722. Stage 722 includes a plane mirror for reflecting a measurement beam 754 directed to the stage by interferometry system 726. A positioning system for positioning stage 722 relative to interferometry system 726 is indicated schematically by element 719. Positioning system 719 can include, e.g., piezoelectric transducer elements and corresponding control electronics. The measurement beam reflects back to the interferometry system, which is mounted on exposure base 704. The interferometry system can be any of the embodiments described previously.

During operation, a radiation beam 710, e.g., an ultraviolet (UV) beam from a UV laser (not shown), passes through a beam shaping optics assembly 712 and travels downward after reflecting from mirror 714. Thereafter, the radiation beam passes through a mask (not shown) carried by mask stage 716. The mask (not shown) is imaged onto a wafer (not shown) on wafer stage 722 via a lens assembly 708 carried in a lens housing 706. Base 704 and the various components supported by it are isolated from environmental vibrations by a damping system depicted by spring 720.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In addition, the lithographic scanner can include a column reference in which interferometry system 726 directs the reference beam to lens housing 706 or some other structure that directs the radiation beam rather than a reference path internal to the interferometry system. The interference signal produce by interferometry system 726 when combining measurement beam 754 reflected from stage 722 and the reference beam reflected from lens housing 706 indicates changes in the position of the stage relative to the radiation beam. Furthermore, in other embodiments the interferometry system 726 can be positioned to measure changes in the position of reticle (or mask) stage 716 or other movable components of the scanner system. Finally, the interferometry systems can be used in a similar fashion with lithography systems involving steppers, in addition to, or rather than, scanners.

Figure 7A:
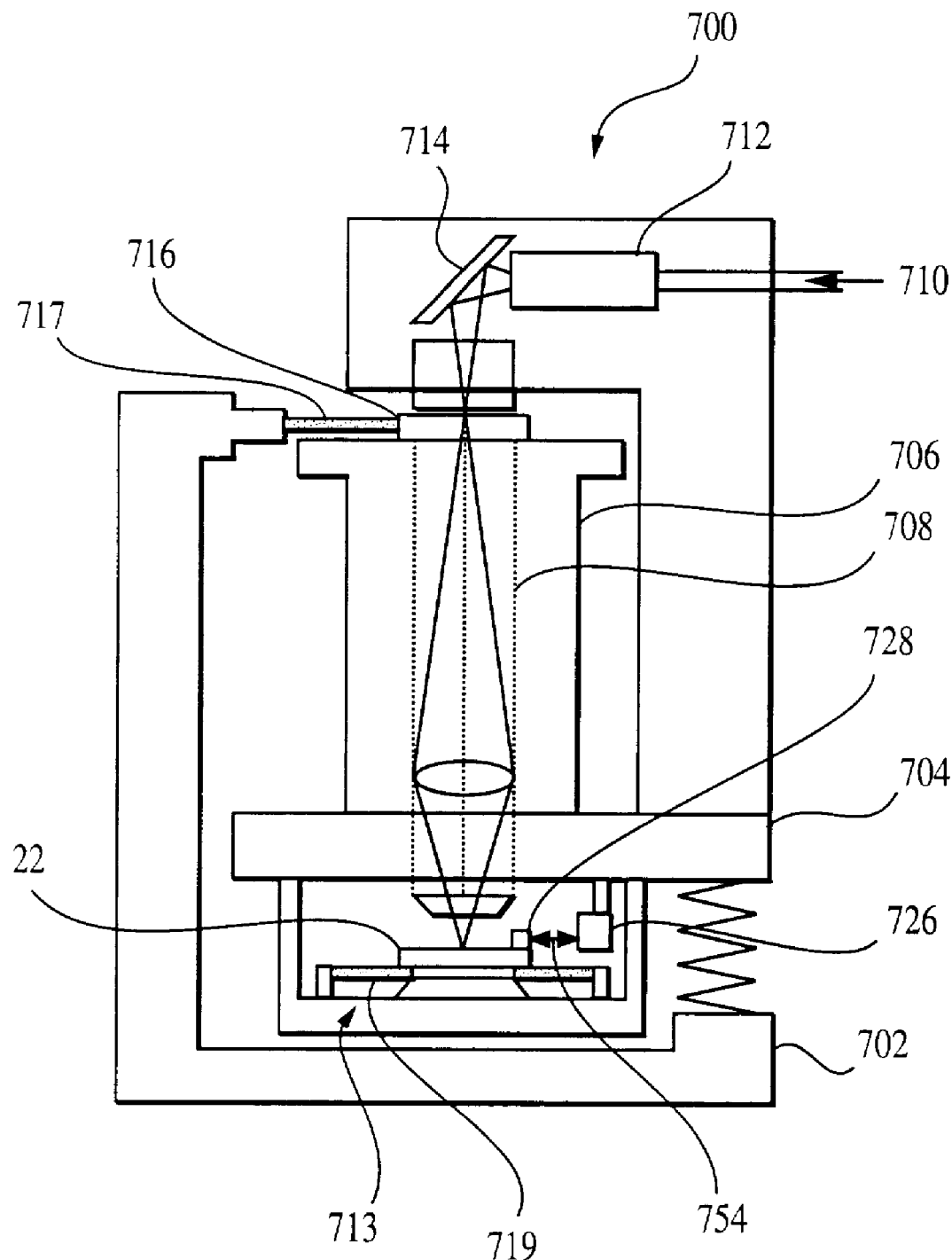
FIGS. 7a–c relate to lithography and its application to manufacturing integrated circuits.
Figure 7B:
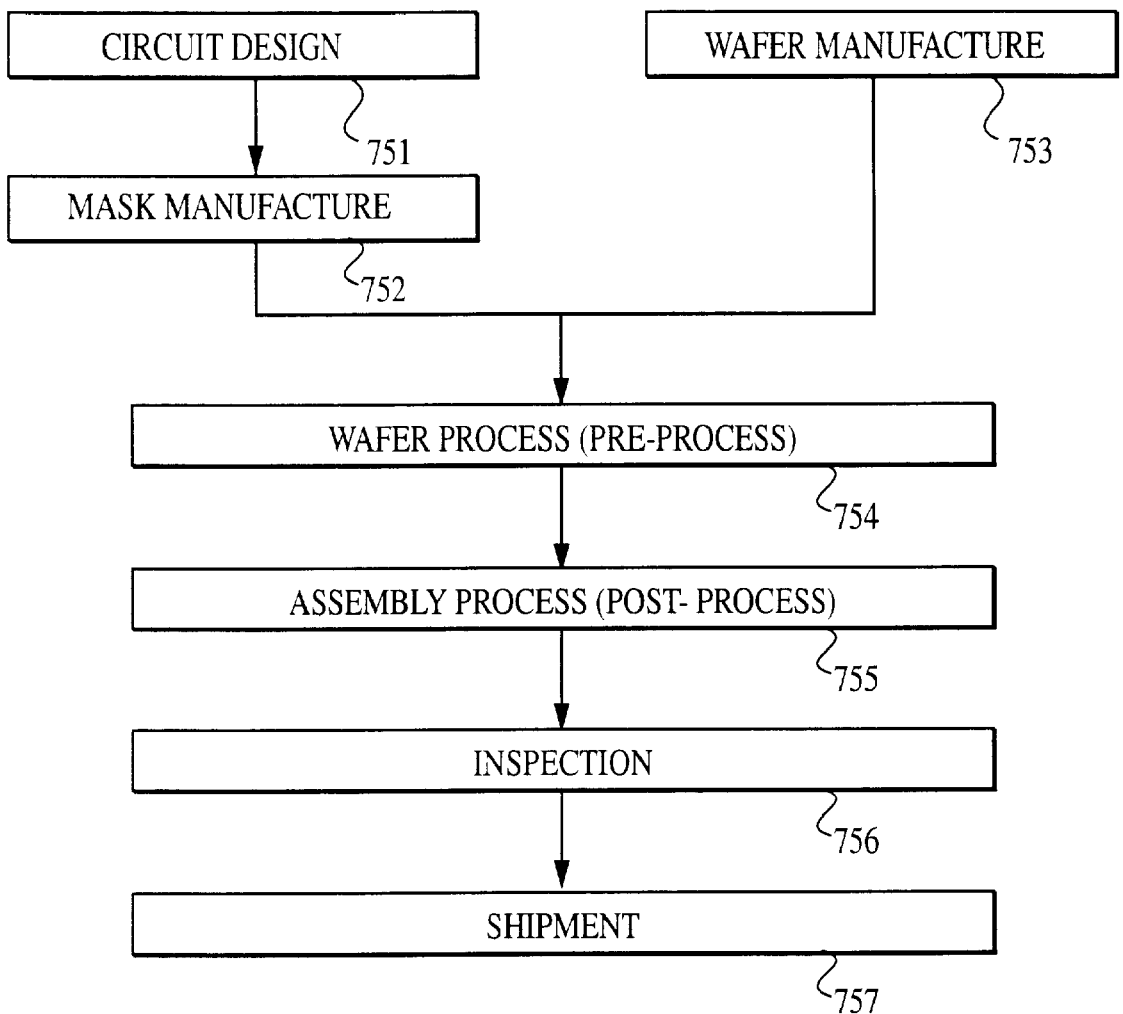

As is well known in the art, lithography is a critical part of manufacturing methods for making semiconducting devices. For example, U.S. Pat. No. 5,483,343 outlines steps for such manufacturing methods. These steps are described below with reference to FIGS. 7b and 7c. FIG. 7b is a flow chart of the sequence of manufacturing a semiconductor device such as a semiconductor chip (e.g. IC or LSI), a liquid crystal panel or a CCD. Step 751 is a design process for designing the circuit of a semiconductor device. Step 752 is a process for manufacturing a mask on the basis of the circuit pattern design. Step 753 is a process for manufacturing a wafer by using a material such as silicon.

Step 754 is a wafer process which is called a pre-process wherein, by using the so prepared mask and wafer, circuits are formed on the wafer through lithography. Step 755 is an assembling step, which is called a post-process wherein the wafer processed by step 754 is formed into semiconductor chips. This step includes assembling (dicing and bonding) and packaging (chip sealing). Step 756 is an inspection step wherein operability check, durability check and so on of the semiconductor devices produced by step 755 are carried out. With these processes, semiconductor devices are finished and they are shipped (step 757).

Figure 7C:
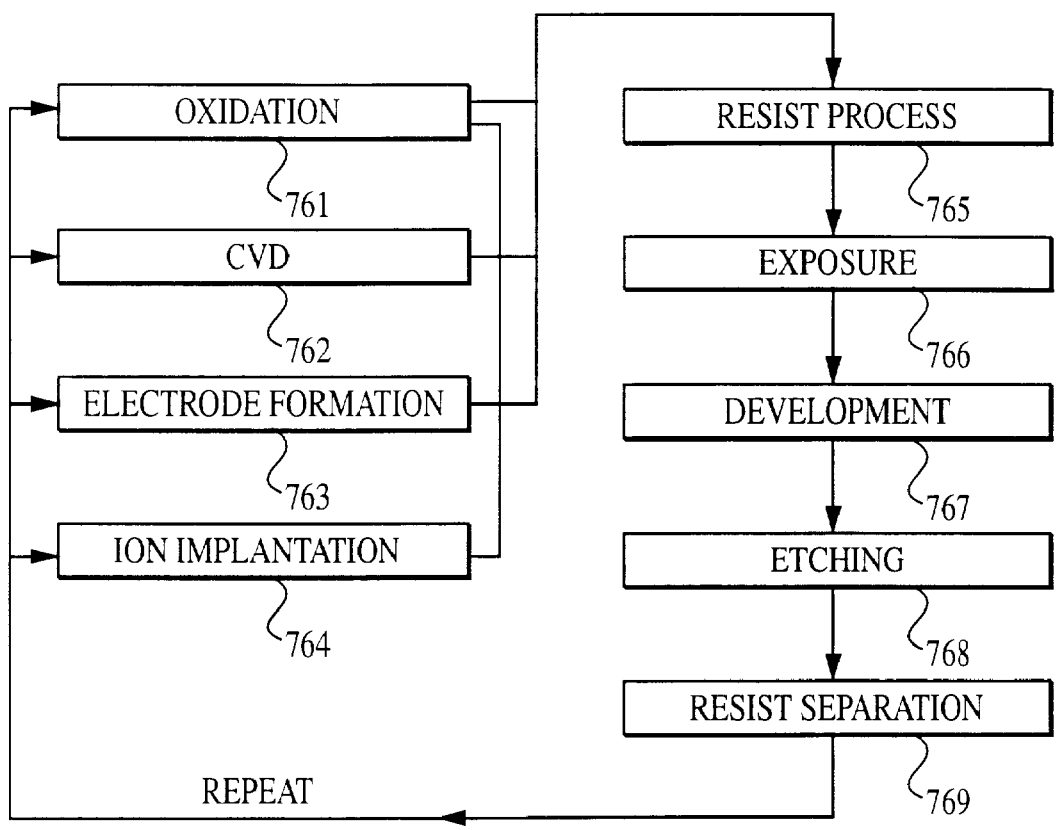

FIG. 7c is a flow chart showing details of the wafer process. Step 761 is an oxidation process for oxidizing the surface of a wafer. Step 762 is a CVD process for forming an insulating film on the wafer surface. Step 763 is an electrode forming process for forming electrodes on the wafer by vapor deposition. Step 764 is an ion implanting process for implanting ions to the wafer. Step 765 is a resist process for applying a resist (photosensitive material) to the wafer. Step 766 is an exposure process for printing, by exposure, the circuit pattern of the mask on the wafer through the exposure apparatus described above. Step 767 is a developing process for developing the exposed wafer. Step 768 is an etching process for removing portions other than the developed resist image. Step 769 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 8:
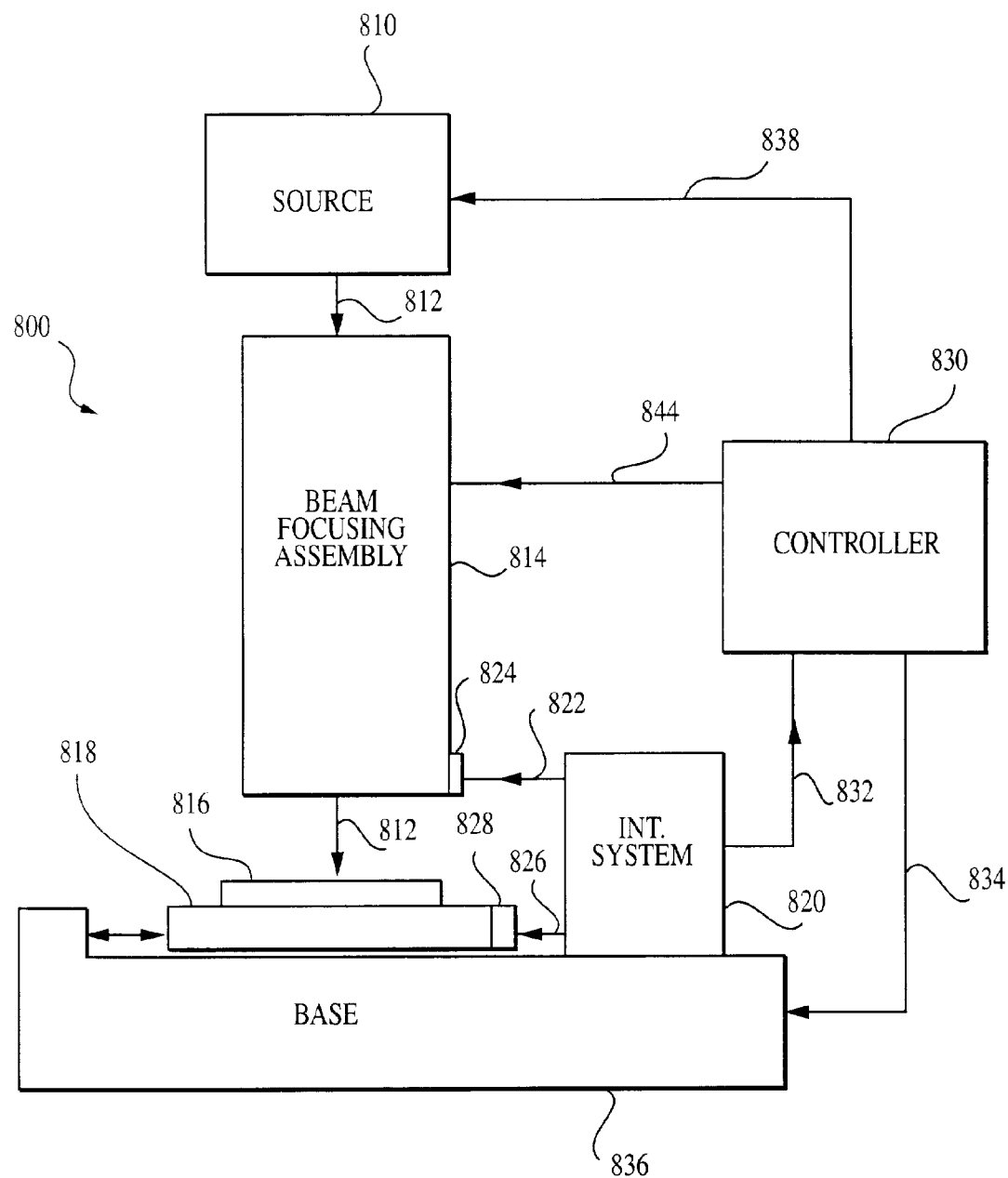
FIG. 8 is a schematic of a beam writing system employing an interferometry system having the phase measurement portion of FIG. 1.

As an example, a schematic of a beam writing system 800 is shown in FIG. 8. A source 810 generates a write beam 812, and a beam focusing assembly 814 directs the radiation beam to a substrate 816 supported by a movable stage 818. To determine the relative position of the stage, an interferometry system 820 directs a reference beam 822 to a mirror 824 mounted on beam focusing assembly 814 and a measurement beam 826 to a mirror 828 mounted on stage 818. Interferometry system 820 can be any of the interferometry systems described previously. Changes in the position measured by the interferometry system correspond to changes in the relative position of write beam 812 on substrate 816. Interferometry system 820 sends a measurement signal 832 to controller 830 that is indicative of the relative position of write beam 812 on substrate 816. Controller 830 sends an output signal 834 to a base 836 that supports and positions stage 818. In addition, controller 830 sends a signal 838 to source 810 to vary the intensity of, or block, write beam 812 so that the write beam contacts the substrate with an intensity sufficient to cause photophysical or photochemical change only at selected positions of the substrate. Furthermore, in some embodiments, controller 830 can cause beam focusing assembly 814 to scan the write beam over a region of the substrate, e.g., using signal 844. As a result, controller 830 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

OTHER EMBODIMENTS

Other embodiments are also within the scope of the invention. As indicated previously, the phase measurement portion of the interferometry system can be used with different types of interferometers. For example, the interferometers include those that receive spatially separated input beams, those that produce spatially separated exit beams, those that include multiple passes to the measurement object, and those that use plane mirrors, retroreflectors, or a combination of both to redirect reference and measurement beams.

Also, the quarter wave plate can be replaced with any set of optics that introduce a phase retardation substantially equal to a quarter wave between components of the exit reference and measurement beams contained in the second output beam.

Other aspects, advantages, and modifications are within the scope of the following claims.

What is claimed is:

1. A phase measurement system for minimizing cyclic errors in a relative phase between exit reference and measurement beams emerging from an interferometer, the phase measurement system comprising:

a first optical processing channel comprising a first polarizer and a first detector, wherein during operation a first portion of the exit reference and measurement beams pass through the first polarizer to produce a first mixed beam and wherein the first detector measures an intensity of the first mixed beam;

a second optical processing channel comprising a quarter wave retarder, a second polarizer, and a second detector, wherein during operation a second portion of the exit reference and measurement beams passes through the retarder and then the second polarizer to produce a second mixed beam and wherein the second detector measures an intensity of the second mixed beam; and a signal processor which during operation receives signals from the first and second detectors indicative of the intensities of the first and second mixed beams and processes the signals to determine, and minimize cyclic errors in, the relative phase between the exit reference and measurement beams, wherein the signal processor comprises a first phase interpolator which during operation receives the first signal and determines a phase of the first signal and a second phase interpolator which during operation receives the second signal and determines a phase of the second signal.

2. The system of claim 1, wherein the exit reference and measurement beams have different frequencies that define a heterodyne signal in each of the first and second signals and the phases determined by the phase interpolators correspond to the heterodyne signals.

3. The system of claim 1, wherein the signal processor further comprises an operational circuit connected to the first and second phase interpolators, wherein during operation the operational circuit processes the phases determined by the phase interpolators to determine the relative phase between the exit reference and measurement beams.

4. The system of claim 3, wherein the operational circuit averages the phases determined by the phase interpolators to determine the relative phase between the exit reference and measurement beams.

5. A phase measurement system for minimizing cyclic errors in a relative phase between exit reference and measurement beams emerging from an interferometer, the phase measurement system comprising:

a first optical processing channel comprising a first polarizer and a first detector, wherein during operation a first portion of the exit reference and measurement beams pass through the first polarizer to produce a first mixed beam and wherein the first detector measures an intensity of the first mixed beam;

a second optical processing channel comprising a quarter wave retarder, a second polarizer, and a second detector, wherein during operation a second portion of the exit reference and measurement beams passes through the retarder and then the second polarizer to produce a second mixed beam and wherein the second detector measures an intensity of the second mixed beam; and a signal processor which during operation receives signals from the first and second detectors indicative of the intensities of the first and second mixed beams and processes the signals to determine, and minimize cyclic errors in, the relative phase between the exit reference and measurement beams, wherein the signal processor includes a phase-shifter that phase shifts one of the signals relative to the other signal and an operational circuit that processes the phase-shifted signal and the other signal to produce a processed signal indicative of an average intensity.

6. The system of claim 5, wherein the processed signal is indicative of a weighted arithmetic average of the intensities of the mixed beams.

7. The system of claim 5, wherein the signal processor further includes a phase interpolator connected to the operational circuit and wherein during operation the phase interpolator determines a phase of the processed signal to give relative phase between the exit reference and measurement beams.

8. The system of claim 1, wherein the exit reference and measurement beams having substantially orthogonal linear polarizations.

9. The system of claim 8, wherein a fast axis of the quarter wave retarder is oriented substantially parallel to one of the substantially orthogonal linear polarizations.

10. The system of claim 1, further comprising a non-polarizing beam splitter for separating the exit reference and measurement beams into the first and second portions.

11. The system of claim 1, wherein the exit reference and measurement beams comprise different frequencies, and the signals generated by the detectors each include a heterodyne signal defined by the different frequencies.

12. An interferometry system comprising the interferometer and the phase measurement system of claim 1.

13. The system of claim 5, wherein the exit reference and measurement beams having substantially orthogonal linear polarizations.

14. The system of claim 13, wherein a fast axis of the quarter wave retarder is oriented substantially parallel to one of the substantially orthogonal linear polarizations.

15. The system of claim 5, further comprising a non-polarizing beam splitter for separating the exit reference and measurement beams into the first and second portions.

16. The system of claim 5, wherein the exit reference and measurement beams comprise different frequencies, and the signals generated by the detectors each include a heterodyne signal defined by the different frequencies.

17. An interferometry system comprising the interferometer and the phase measurement system of claim 5.

18. An interferometry method for reducing cyclic errors, the method comprising:
  mixing polarizations of a first portion of exit reference and measurement beams from an interferometer to produce a first mixed beam;
  introducing a quarter wave phase shift between polarizations of a second portion of the exit reference and measurment beams to produce a retarded beam;
  mixing polarizations of the retarded beam to produce a second mixed beam;
  measuring intensities of the first and second mixed beams; and
  processing the measured intensities to reduce cyclic errors.

19. The interferometry method of claim 18 wherein processing comprises determining a phase for each of the intensities of the first and second mixed beams.

20. The interferometry method of claim 19, wherein the exit reference and measurement beam have different frequencies that define a heterodyne signal in each of the intensities and the determined phases correspond to the heterodyne signal.

21. The interferometry method of claim 20 wherein processing further comprises averaging the phases of the intensities of the first and second mixed beams to define an average phase with reduced cyclic error.

22. The interferometry method of claim 18, wherein the exit reference and measurement beam have different frequencies that define a heterodyne signal in each of the intensities and processing comprises determining the heterodyne signal in each of the intensities.

23. The interferometry method of claim 22, wherein processing further comprises phase shifting one of the heterodyne signals relative to the other and averaging the phase-shifted heterodyne signal and the other heterodyne signal to give an average heterodyne signal.

24. The interferometry method of claim 23, wherein processing further comprises determining a phase of the average heterodyne signal.

25. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and an interferometry system having the phase measurement system of one of claim 1 and claim 5 for measuring the position of the wafer relative to the imaged radiation.

26. A lithography system for use in fabricating integrated circuits on a wafer, the system comprising:

a stage for supporting the wafer; and an illumination system including a radiation source, a mask, a positioning system, a lens assembly, and an interferometry system having the phase measurement system of one of claim 1 and claim 5, wherein during operation the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

27. A lithography system for fabricating integrated circuits comprising first and second components, the first and second components being movable relative to each other, and an interferometry system having the phase measurement system of one of claim 1 and claim 5, wherein the first components comprises the measurement object and the interferometry system monitors the position of the first component relative to the second component.

28. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and an interferometry system having the phase measurement system of one of claim 1 and claim 5 for measuring the position of the stage relative to the beam directing assembly.

29. A lithography method for use in fabricating integrated circuits comprising:

imaging spatially patterned radiation onto a wafer;

positioning the wafer relative to the imaged radiation; and measuring the position of the wafer relative to the imaged radiation using the interferometry method of claim 18, wherein one of a stage supporting the wafer and an illumination system producing the radiation includes the measurement object.

30. A lithography method for use in the fabrication of integrated circuits comprising:

directing input radiation through a mask to produce spatially patterned radiation;

positioning the mask relative to the input radiation;

measuring the position of the mask relative to the input radiation using the interferometry method of claim 18, wherein one of a stage supporting the mask and a illumination system providing the input radiation include the measurement object; and imaging the spatially patterned radiation onto a wafer.

31. A lithography method comprising:

positioning a first component of a lithography system relative to a second component of a lithography system to expose a wafer to spatially patterned radiation; and measuring the position of the first component relative to the second component using the method of claim 18 wherein the first component includes the measurement object.

32. A beam writing method for use in fabricating a lithography mask, the method comprising:

directing a write beam to a substrate to pattern the susbtrate;

positioning the substrate relative to the write beam; and measuring the position of the substrate relative to the write beam using the interferometry method of claim 18.

* * * * *